(12) United States Patent
Schwalbe et al.

(10) Patent No.: US 7,199,060 B2
(45) Date of Patent: Apr. 3, 2007

(54) METHOD FOR PATTERNING DIELECTRIC LAYERS ON SEMICONDUCTOR SUBSTRATES

(75) Inventors: Grit Schwalbe, Dresden (DE); Thomas Ruder, Dresden (DE)

(73) Assignee: Infineon Technologies AG, Munich (DE)

( * ) Notice: Subject to any disclaimer, the term of this patent is extended or adjusted under 35 U.S.C. 154(b) by 415 days.

(21) Appl. No.: 10/724,141

(22) Filed: Dec. 1, 2003

(65) Prior Publication Data
US 2004/0152332 A1   Aug. 5, 2004

(30) Foreign Application Priority Data
Nov. 29, 2002   (DE) ................ 102 55 865

(51) Int. Cl.
*H01L 21/302* (2006.01)
*H01L 21/461* (2006.01)
*H01L 21/4763* (2006.01)
*H01L 21/311* (2006.01)

(52) U.S. Cl. .............. 438/725; 438/637; 438/700; 438/745

(58) Field of Classification Search ........ 438/622, 438/637–640, 700–702, 725, 710, 706, 735, 438/737, 745, 753, 756–757
See application file for complete search history.

(56) References Cited

U.S. PATENT DOCUMENTS

| | | | |
|---|---|---|---|
| 5,660,681 A | 8/1997 | Fukuda et al. .......... 438/695 |
| 6,232,237 B1 | 5/2001 | Tamaoka et al. ........... 438/725 |
| 6,235,453 B1 | 5/2001 | You et al. ................. 430/329 |
| 6,413,877 B1 * | 7/2002 | Annapragada ............ 438/723 |
| 6,576,547 B2 * | 6/2003 | Li .............................. 438/637 |
| 2001/0005635 A1 | 6/2001 | Kitagawa .................. 438/710 |
| 2002/0076935 A1 | 6/2002 | Maex et al. ............... 438/706 |
| 2002/0146647 A1 | 10/2002 | Aoki et al. ............... 430/313 |
| 2002/0164877 A1 | 11/2002 | Catabay et al. ........... 438/694 |

OTHER PUBLICATIONS

Article entitled "Limitation of HF-Based Chemistry for Deep-Submicron Contact Hole Cleaning on Silicides" by M.R. Baklanov et al., J. Electrochem. Soc., vol. 145, No. 9 Sep. 1998 by The Electrochemical Society, Inc., pp. 3240-3246. Article entitled "low-k dielectric etching" by D.J. Thomas et al., published Mar. 2001 in Solid State Technology, pp. 107, 108, 112-116 (www.solid-state.com).

Copy of German Office Action dated Oct. 20, 2003.

* cited by examiner

*Primary Examiner*—Thanhha Pham
(74) *Attorney, Agent, or Firm*—Slater & Matsil, L.L.P.

(57) ABSTRACT

The invention relates to a process for patterning dielectric layers. A photoresist layer is applied to the dielectric layer and patterned. Then, the pattern which has been predetermined by the resist mask is transferred to the dielectric layer. The incineration of the resist mask is carried out a temperature of 50° C. to 200° C., with the oxygen plasma being generated from a gas which has an oxygen content of 40 to 60% by volume. During a subsequent step of cleaning the patterned dielectric layer using dilute hydrofluoric acid, the trenches which have been introduced into the dielectric layer are widened to a significantly lesser extent than after incineration under the conditions which have previously been customary.

19 Claims, 3 Drawing Sheets

METHOD FOR PATTERNING DIELECTRIC LAYERS ON SEMICONDUCTOR SUBSTRATES

BACKGROUND

1. Field of the Invention

The invention relates to semiconductor memory devices and, more particularly, to a method for patterning dielectric layers on semiconductor substrates to produce contact holes or trenches in the dielectric layer.

2. Background Information

To continue increasing the power of microprocessors and memory chips, it is necessary for the dimensions of the individual microelectronic components, such as capacitors or transistors, to be constantly reduced further. This allows a higher integration density to be achieved on a given chip surface area and also allows the operations carried out per unit time to be shortened. To enable the integration density to be further increased, different microelectronic components are increasingly being stacked on top of one another in layers. To allow the individual microelectronic components in each case to be driven in a controlled manner, therefore, it is necessary to use a plurality of interconnect levels that are arranged above one another and are in each case isolated from one another by insulating dielectric layers.

During production of a microchip, the structures of the individual components are generally produced by sequential deposition of layers of different materials. To allow targeted processing of sections of these layers, masks are produced from a photosensitive resist that can be patterned using lithography methods. After the exposed photoresist has been developed, during which step certain sections of a layer of the photoresist are removed selectively, sections of the layer arranged beneath the resist mask are uncovered and can then be processed selectively. After the processing step, the resist mask is removed again. For this purpose, the resist mask can, for example, be dissolved using a suitable solvent or incinerated in an oxygen plasma. This is generally followed by a wet-chemical cleaning step in order to remove residues of organic materials and oxide layers that were formed in the oxygen plasma from the surface.

During the production of a contact hole, through which a conductive connection is to be produced between an electronic component arranged in a lower level, such as the source contact of a transistor, and an interconnect arranged in a higher level, the procedure has hitherto been, in the most simple case, for an insulating dielectric layer to be deposited on the level which comprises the contact of an electronic component and to which a conductive connection is to be produced. A layer of a photosensitive resist is deposited on this dielectric layer, and the resist layer is then exposed in sections and developed in a conventional manner such that the dielectric layer is uncovered in the section in which the contact hole is to be introduced. Then, the contact hole is etched into the dielectric layer using a suitable plasma, for example, a fluorine-containing plasma, so that the contact to the microelectronic component is uncovered at the base of the contact hole.

Next, the resist film or resist mask is incinerated in an oxygen plasma. The incineration is carried out at a temperature of approximately 250° C. within approximately 1 to 1.5 minutes. The oxygen plasma is generated from a gas mixture which substantially comprises oxygen and to which small quantities of a forming gas have been added. The forming gas serves to stabilize the plasma and usually consists of a mixture of nitrogen gas and hydrogen gas. The proportion of the forming gas in the gas for generating the oxygen plasma is generally selected to be between 3 and 10% by volume, usually in the region of approx. 5% by volume. This is followed by wet-chemical cleaning of the patterned surface of the dielectric layer under oxidizing conditions in order to remove organic residues adhering to the surface. An example of a standard cleaning agent is $H_2SO_4$ in combination with $O_3$.

The contact that is uncovered at the base of the contact hole usually consists of silicon which is provided, for example, with a doping. Therefore, a thin film of oxide is formed in the oxygen plasma or as a result of oxygen or water from the ambient air, and this thin film of oxide must first be removed before the contact hole is filled with a conductive material. For this purpose, the surface is cleaned using highly dilute aqueous hydrofluoric acid which is buffered, for example, with $NH_4F$. However, this removes not only the oxide layer at the base of the contact hole, but also material on the side walls of the contact hole. Therefore, the cleaning with buffered hydrofluoric acid widens the structures which have been etched into the dielectric layer. The same problem arises if the contact is composed of a metallic layer, for example for producing Vias between interconnect levels arranged above one another. In this case too, an oxide layer is formed on the surface of the contact and must firstly be removed before the contact hole is filled. Hydrofluoric acid can be used as a standard etchant for this purpose.

With the current feature sizes that are realized in the production of microchips, it is possible to control the widening by optimizing the process conditions for cleaning with dilute hydrofluoric acid. For this purpose, by way of example, the concentration of the hydrofluoric acid, the temperature at which the cleaning is carried out and the duration of the cleaning can be optimized. Furthermore, when designing the chip it is possible to take into account the widening of the contact holes or trenches that occurs during the cleaning using dilute hydrofluoric acid. The widening that has to be taken into account as a result of the cleaning using buffered dilute hydrofluoric acid is currently in the range from approx. 25 to 38% with respect to the etched dimension. A further reduction in the widening by, for example, shortening the cleaning time no longer appears possible, since in this case the oxide layer on the contact at the base of the contact hole can no longer be removed to a sufficient extent.

Future chip technology will require the production of a critical feature size in the region of 90 nm or below. In this case, it is no longer possible to take account of the widening of the contact holes which are introduced into a dielectric layer when designing the microchip. Since the widening of the contact holes is independent of the diameter thereof, i.e. becomes ever more pronounced as the feature size is reduced, it is imperative to find ways of producing contact holes with the required high level of accuracy even for a critical feature size of less than 90 nm.

SUMMARY

Embodiments of the invention are described for providing a process for patterning dielectric layers on semiconductor substrates that enable production of contact holes or trenches in the dielectric layer with a high level of accuracy, even for small dimensions.

A method is described for patterning dielectric layers on semiconductor substrates. A first layer is provided, and at least one layer formed from a dielectric is deposited on the first layer, so that a dielectric layer is obtained. A photosensitive resist layer is deposited on the dielectric layer. The resist layer is exposed and developed in sections, so that a resist mask is obtained, through which sections of the dielectric layer are uncovered. The dielectric layer is removed in the sections which have been uncovered through the resist mask at least down to a depth which is such that the first layer is uncovered.

In one embodiment of the invention, the resist mask is incinerated in an oxygen plasma, the incineration being carried out at a temperature which is selected to be approximately 200° C. or lower. In another embodiment, the oxygen plasma is generated from a gas which at least contains oxygen gas and a forming gas, the oxygen gas being present in an amount of approximately 60% or less by volume and the forming gas being present in an amount of approximately 40% or more by volume, so that a patterned dielectric layer is obtained. In a further embodiment, the patterned dielectric layer is cleaned using aqueous dilute hydrofluoric acid.

The invention is explained in more detail below with reference to diagrammatic drawings on the basis of preferred exemplary embodiments of the methods according to the invention.

BRIEF DESCRIPTION OF THE DRAWINGS

The invention is explained in more detail below with reference to the appended drawings, in which, in detail.

DETAILED DESCRIPTION

It has been found that the widening of the holes or trenches introduced into the dielectric layer, which is observed during the final cleaning step using aqueous dilute hydrofluoric acid, can be influenced by the conditions under which incineration of the resist mask is carried out. Optimizing the conditions for the incineration of the resist mask makes it possible to reduce the extent to which the trenches or holes which have been introduced into the dielectric layer are widened. Therefore, the process according to the invention makes it possible to produce contact holes or trenches with a high level of accuracy and with a smaller diameter than can be achieved with the processes which are currently customary.

Figure 1A:
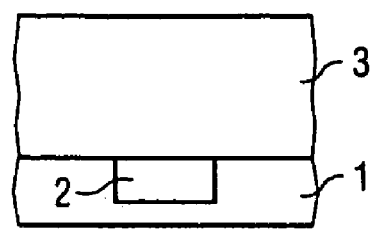
FIGS. 1A–1E illustrate steps involved in carrying out a process for patterning dielectric layers according to an embodiment of the present invention.

FIG. 1A shows a layer 1 comprising a dielectric into which an interconnect 2 has been introduced. The interconnect 2 is composed, for example, of aluminum and forms the first layer in the context of the invention. A further dielectric layer 3, which consists, for example, of silicon dioxide and into which a contact hole is to be introduced in order to produce a Via, is arranged on the layer 1.

Figure 1B:
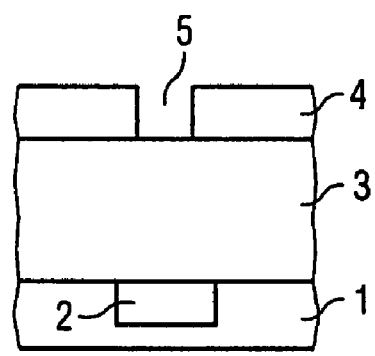
Figure 1C:
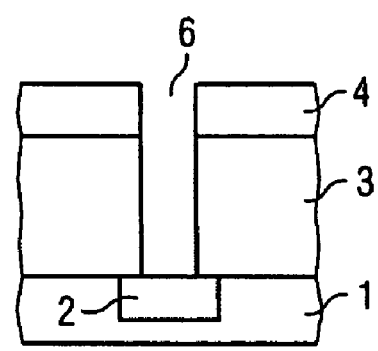
Figure 1D:
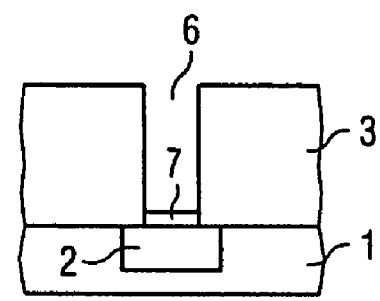
Figure 1E:
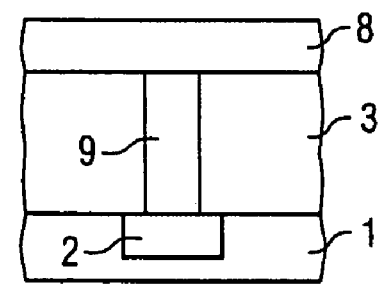

As illustrated in FIG. 1B, a photosensitive layer 4 is applied to the dielectric layer 3, exposed and developed, in order to define an opening 5, which serves as a mask for the production of the contact hole. Then, as shown in FIG. 1C, a contact hole 6 is etched through the dielectric layer 3 in a conventional manner using a fluorine-containing plasma, extending as far as the interconnect 2. In the next working step, the photosensitive layer 4 is incinerated in an oxygen-containing plasma. Typical incineration conditions are given below:

Temperature: 195° C. (50° C.–200° C.)
Oxygen: 1 000 sccm (<2 000 sccm)
$O_2$/forming gas ratio: 1/1 (V/V)
Forming gas: 1 000 sccm
Treatment duration: 50 s As illustrated in FIG. 1D, the top side of the dielectric layer 3 is uncovered again and an oxide layer 7 forms on the uncovered surface of the interconnect 2 at the base of the contact hole 6. The oxide layer 7 can be removed using dilute hydrofluoric acid. The contact hole 6 is only slightly widened in the process. Then, the contact hole 6 is filled with a conductive material in the usual way, and after this a further interconnect 8 is deposited, as shown in FIG. 1E. The interconnects 2 and 8 are electrically conductively connected by a Via 9.

FIG. 2 shows steps that are involved in carrying out the process according to embodiments of the invention. As can be seen, the dielectric layer 3 comprises a plurality of layers made from different materials. FIG. 2A shows a semiconductor layer 10, for example a silicon wafer, in which a doped region 11, to which a conductive connection is to be produced, is defined. A dielectric layer 3 composed of a plurality of individual layers is arranged on the semiconductor layer 10. With the arrangement illustrated in FIG. 2A, first a layer 12 of a borophosphosilicate glass (BPSG) is deposited on the semiconductor layer 10. A silicon carbide layer 13 is deposited on this layer 12. More particularly, this layer 13 substantially comprises silicon carbide with a high hydrogen content produced by chemical vapor deposition. Finally, the top layer provided is a silane oxide layer 14, which is produced by chemical vapor deposition, for example from silicon tetrachloride and water.

Figure 2A:
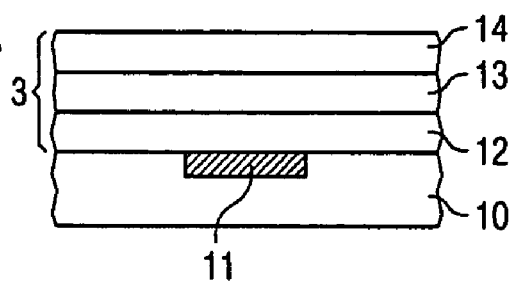
FIGS. 2A–2E illustrate steps involved in carrying out the process of FIG. 1 with the dielectric layer comprising a plurality of layers.
Figure 2B:
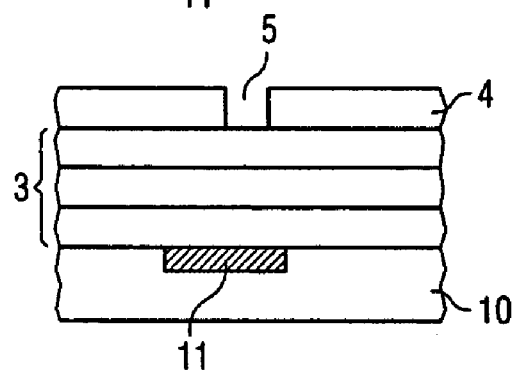
Figure 2C:
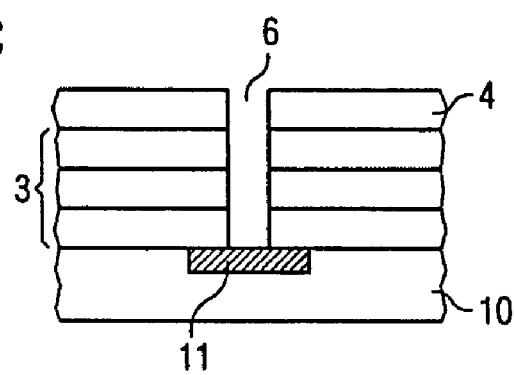

To enable a conductive connection to the doped region 11 to be produced, it is necessary for the section in which a contact hole extending through the dielectric layer 3 is to be introduced to be defined on the surface of the dielectric layer 3. For this purpose, first a layer of a photosensitive resist 4 is applied, selectively exposed and then developed in a conventional manner. The result, as illustrated in FIG. 2B, is a resist mask that comprises an opening 5 in which the surface of the dielectric layer 3 is uncovered. The area that is predetermined by the opening 5 is then etched through the dielectric layer 3 using a fluorine-containing plasma, so that a contact hole 6 is obtained, extending through the dielectric layer 3 to the doped region 11 of the semiconductor layer 10. Then, the photosensitive layer 4 is removed by incineration in the oxygen plasma. The incineration can be carried out under the conditions given for FIG. 1.

Figure 2D:
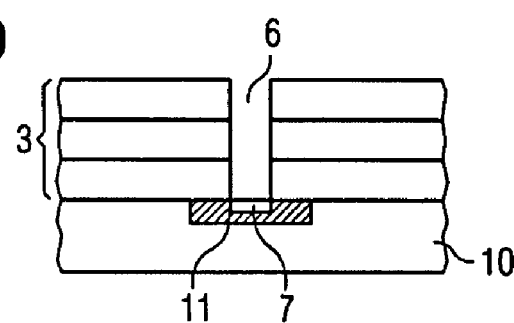
Figure 2E:
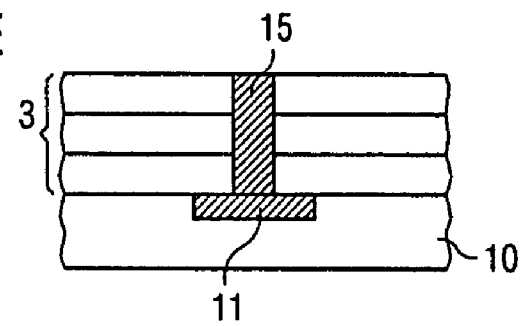

After the incineration of the photosensitive layer 4 in the oxygen plasma, the surface of the dielectric layer 3 has been uncovered again. At the same time, however, a thin film of oxide 7 forms at the base of the contact hole 6, as illustrated in FIG. 2D. If the contact hole 6 were to be filled directly with a conductive material, the oxide film 7 would lead to a high resistance. It is therefore necessary for the oxide film 7 first to be removed by means of treatment with dilute aqueous hydrofluoric acid. For this purpose, aqueous hydrofluoric acid is added to the arrangement illustrated in FIG. 2D (dilution: 1:500; room temperature (23° C.); 30–60 s). The oxide layer 7 is dissolved. At the same time, however, the dilute hydrofluoric acid attacks the side walls of the contact hole 6 which are formed by the dielectric layer 3. However, the extent to which the contact hole 6 is widened is significantly less than after incineration of the photosensitive layer 4 under the conditions which have hitherto been customary. After the oxide layer 7 has been removed, the contact hole 7 is filled with a conductive material 15 in order, as illustrated in FIG. 1E, to produce a conductive connection extending through the dielectric layer 3 to the doped region 11 in the semiconductor layer 10.

The influence of the incineration conditions on the removal of the dielectric layer can be demonstrated by the following examples.

Figure 3:
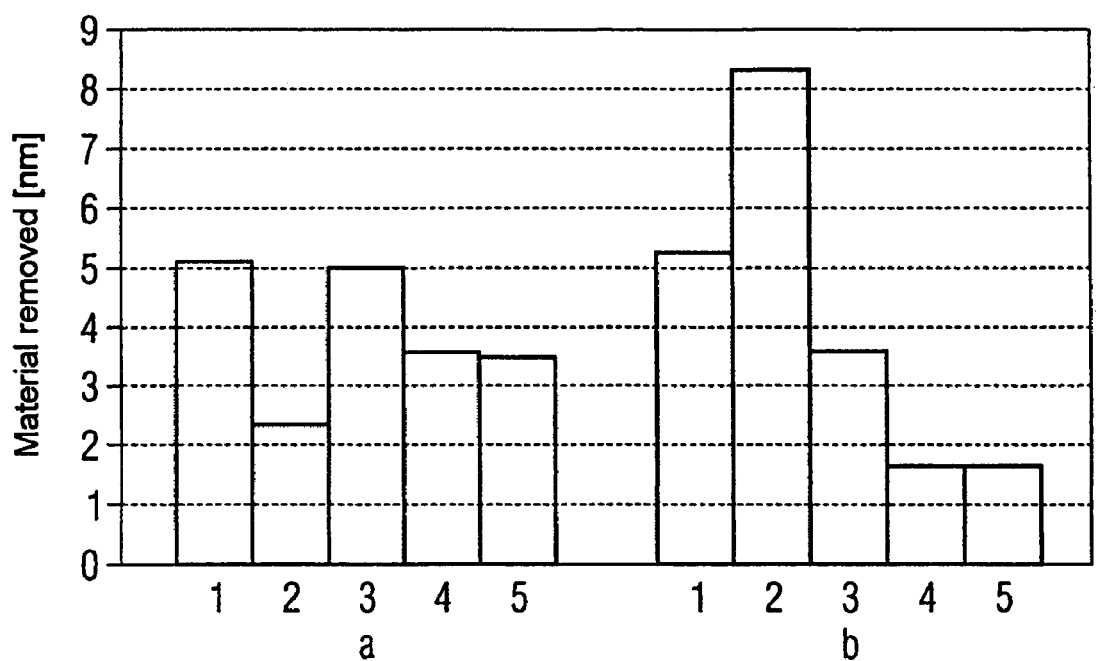
FIG. 3 is a graph illustrating an amount of a dielectric material removed after a treatment in the oxygen plasma and after a cleaning with buffered hydrofluoric acid.

Blank silicon wafers as semiconductor material are coated with a silicon carbide layer of a certain layer thickness. A layer of a photoresist is applied to this silicon carbide layer. The photoresist is then incinerated using an oxygen plasma. The conditions given in Table 1 are set in this case. The incineration is carried out in different plasma chambers (plasma chambers A and B) and at different temperatures and oxygen concentrations. After the incineration of the photoresist layer, the layer thickness of the silicon carbide layer is determined, and the layer thickness loss caused by the incineration is calculated from the difference. The layer thickness loss is represented in FIG. 3a in the form of a bar chart. It can be seen that during the incineration the removal of the silicon carbide layer is influenced by the temperature and by the oxygen concentration in the plasma. However, no clear trend can be determined. The removal of material from the layer is influenced not only by the temperature and the oxygen concentration but also, for example, by the type of plasma chamber used.

Then, all the wafers are treated under identical conditions with a dilute aqueous buffered hydrofluoric acid ($H_2O$/HF=500:1; 23° C.; 60 s). After the treatment, the layer thickness of the silicon carbide layer is determined again, and the further layer thickness loss is calculated therefrom. The further layer thickness loss is illustrated in FIG. 3B. It can be seen that the silicon wafers which have been treated using the process according to the invention are subject to significantly less layer thickness loss during the treatment with dilute hydrofluoric acid than silicon wafers on which the incineration takes place at higher temperatures and/or at higher oxygen concentrations. The overall loss of layer thickness is determined by adding together the values from FIG. 3A and FIG. 3B. It can be seen that when the process according to the invention is being carried out, the layer thickness loss is considerably lower than after incineration under the conditions which have hitherto been customary. This means that contact holes or trenches can be introduced into a dielectric layer with a significantly smaller diameter, since significantly reduced widening of the opening is observed during the cleaning using dilute aqueous hydrofluoric acid.

The process conditions used to incinerate the photoresist layer are given in Table 1 below.

TABLE 1

Reaction conditions for the incineration of the resist layer

| Wafer | Plasma chamber | Temperature (° C.) | $O_2$ (sccm) | $N_2/H_2$ 1:1 (sccm) |
|---|---|---|---|---|
| 1 | A | 250 | 4000 | 200 |
| 2 | B | 250 | 4000 | 200 |
| 3 | B | 195 | 4000 | 200 |
| 4 | B | 195 | 1000 | 1000 |
| 5 | B | 195 | 1000 | 1000 |

The process according to the invention is fundamentally suitable for any desired dielectric materials. In addition to the materials silicon carbide (SiC(H)), BPSG (borophosphosilicate glass) and silane oxide which have already been described, the process is also suitable, for example, for patterning TEOS (tetraethylene orthosilicate), thermal oxides, phosphorus-doped silicon glass, FSG (fluorinated silicate glass), SiC(N), SiOC and similar compounds as well as inorganic low K materials.

Thus, when carrying out the method according to the invention, the procedure is that first a first layer is provided. This first layer may, for example, be a semiconductor layer which, for example, comprises doped regions, and contact is to be produced between these regions and an interconnect level. The semiconductor layer generally consists of silicon which may, for example, be provided for the purpose of producing a source or drain contact of a transistor having a doping. The first layer may also be formed by a semiconductor substrate into which a trench is to be introduced, for example for the fabrication of a trench capacitor. Furthermore, the first layer may also be composed of a metal and be designed, for example, as an interconnect, to which contact is to be produced, for example as a Via leading to an interconnect level arranged higher up.

At least one layer of an insulating material is then deposited on this first layer, so that a dielectric layer is obtained. The dielectric layer may comprise a single layer which is formed homogeneously from a single material. However, it is also possible for a plurality of layers of in each case different dielectric materials to be arranged above one another, and these layers together then form the dielectric layer into which a contact hole is to be introduced, extending as far as the first layer. The dielectric layer is deposited using standard processes, for example by chemical vapor deposition (CVD). The insulating materials used may inherently be all customary materials. Typical examples include oxide layers, in particular layers of silicon dioxide, or else layers comprising a silicate glass, for example a borophosphosilicate glass.

To define the area of the dielectric layer that is to be removed for the production of a trench or a contact hole, a layer of a photosensitive resist is deposited on the dielectric layer. It is possible to use conventional photoresists, as are customarily used in the fabrication of microchips. The photosensitive resist layer is likewise deposited using conventional methods, for example by spin-on processors. The photosensitive resist layer is then exposed in the usual way, in which case a section of the resist film which corresponds to the contact hole is exposed, for example with the aid of a photomask. The resist layer is then developed in the usual way, so that a resist mask is obtained comprising sections in which the dielectric layer is uncovered.

The dielectric layer is then removed in the uncovered sections until the first layer, arranged beneath the dielectric layer, is uncovered again. The dielectric layer may in this case be removed down to the boundary surface between dielectric layer and first layer. However, it is also possible for the removal of material to continue into the first layer, in order, for example, to produce a trench in the first layer. The dielectric layer is removed using standard processes. Generally, a suitable plasma is used. If the dielectric layer consists, for example, of silicon dioxide, the contact hole can be etched, for example, using a fluorine-containing plasma.

When the contact hole has been introduced into the dielectric layer, according to the invention the conditions during the incineration of the resist mask in an oxygen plasma are then selected in such a way that the incineration is carried out at a lower temperature than with the processes which are currently customary. According to the invention, the temperature for the incineration is selected to be lower than 200° C., preferably between 50° C. and 200° C.

Furthermore, the incineration is carried out at a lower oxygen concentration than that which is used in the incineration steps that have previously been customary. During the incineration which has previously been customary, the proportion of oxygen gas in the gas for generating the oxygen plasma is usually selected to be higher than 90% by volume. By contrast, in the process according to the invention the proportion of oxygen in the gas for generating the oxygen plasma is selected to be lower. The oxygen content is suitably selected to be less than 60% by volume, preferably between 40% by volume and 60% by volume, particularly preferably between 40% by volume and 50% by volume. The proportion of forming gas is selected to be correspondingly higher. The forming gas does not directly participate in the incineration of the resist but does stabilize the plasma. In the method according to the invention, the proportion of the forming gas is suitably selected to be greater than 40% by volume, preferably between 60 and 40% by volume, particularly preferably between 60 and 50% by volume.

After the resist mask has been incinerated, the result is a patterned dielectric layer into which, by way of example, contact holes or trenches are introduced, extending through the dielectric layer to the first layer arranged beneath the dielectric layer. Finally, cleaning is carried out using dilute hydrofluoric acid in order to remove an oxide layer which has formed on the first layer at the base of the contact hole or of the trench. This step fundamentally uses the same conditions as have also previously been customary for cleaning of the patterned dielectric layer after resist incineration. The concentration of the dilute aqueous hydrofluoric acid $HF/H_2O$ is generally between 1:300 and 1:500. The cleaning is usually carried out at room temperature and for a duration of between 10 seconds and 120 seconds.

Surprisingly, the contact holes or trenches are widened to a significantly lesser extent than after incineration of the resist layer under the conditions which have hitherto been customary, i.e. with incineration of the photosensitive layer at a high temperature and/or using a plasma with a high oxygen content. Therefore, in addition to the temperature, the duration and the concentration of the aqueous hydrofluoric acid, which are in each case selected during the cleaning using hydrofluoric acid after the incineration of the resist mask, the process according to the invention provides a further parameter which can be used to influence the widening of a contact hole or a trench during the cleaning using aqueous hydrofluoric acid, namely the conditions for the incineration of the resist mask.

After the contact hole or trench has been introduced into the dielectric layer and the final cleaning has taken place, the patterned dielectric layer is processed in the usual way. By way of example, a liner which covers the side walls can be introduced into the trench or contact hole, or the contact hole may, for example, also be filled directly with a conductive material.

The duration of time required to incinerate the resist mask is selected to be as short as possible, in order to minimize damage to the side walls of the trench or the contact hole. A duration of between 30 seconds and 120 seconds is suitably selected for the incineration of the resist mask, particularly preferably a duration of between 30 seconds and 60 seconds. The duration selected for the incineration is influenced by the resist material and by the thickness of the resist layer. However, the person skilled in the art can readily determine an appropriate duration for the incineration of a given resist material with a given layer thickness by means of simple preparatory tests.

In the process according to the invention, the incineration of the resist mask is carried out at an oxygen concentration which is significantly lower than with processes which have hitherto been customary. The oxygen partial pressure in the gas for generating the oxygen plasma is appropriately selected to be between 0.2 and 8.0 Torr, particularly preferably between 0.8 and 1.5 Torr.

In addition to the oxygen gas, the gas for generating the oxygen plasma also contains a forming gas as a further constituent. The forming gas used may, for example, be nitrogen gas. However, it is preferable for the forming gas to contain at least nitrogen gas and hydrogen gas.

The forming gas generally contains the nitrogen gas in excess with respect to the hydrogen gas. The hydrogen gas content in the forming gas is suitably selected to be between 1 and 50% by volume.

The first layer may inherently consist of any desired material. However, it is appropriate to use materials which form water-soluble fluorides. The first layer is particularly preferably composed of silicon. During the incineration of the resist layer, first of all a thin film of silicon dioxide is formed on the semiconductor layer which has been uncovered at the base of the contact hole, and this thin film of silicon dioxide can be removed using dilute hydrofluoric acid. The silicon may also comprise a doping which, for example, increases the electrical conductivity. Doped regions of this type are used, for example, as source or drain contact for field-effect transistors.

As has already been described above, the dielectric layer may inherently be composed of any desired materials which allow a sufficient insulating action to be achieved between different electrically conductive levels. However, the effect which is observed with the method according to the invention is particularly pronounced in the case of dielectrics which are derived from silicon. Therefore, the dielectric layer particularly preferably comprises at least one layer made from a silicate glass and/or a silicon carbide. The silicate glass used may, for example, be silicon dioxide. However, the silicate glass may also contain further elements, for example boron or phosphorus. The silicate glass is deposited using standard processes, for example by chemical vapor deposition. In addition to silicon and carbon, the silicon carbide may also comprise other elements, in particular hydrogen. A silicon carbide with a high proportion of hydrogen atoms can be produced, for example, by chemical vapor deposition.

The final cleaning of the patterned dielectric layer is carried out using dilute aqueous hydrofluoric acid. It is fundamentally also possible to select other solvents in which the hydrofluoric acid is soluble. However, since it is easier to dispose of, it is preferable to use an aqueous dilute hydrofluoric acid. The concentration of the hydrofluoric acid is selected to be as low as possible, in order to allow the treatment times to be controlled with sufficient accuracy and in order to ensure that the minimum possible amount of the dielectric layer is removed at the side walls of the trench or the contact hole. The aqueous dilute hydrofluoric acid appropriately contains HF and $H_2O$ in a ratio of less than 1:400, preferably less than 1:500.

For the final cleaning of the patterned dielectric layer, the treatment time is selected to be as short as possible, in order to avoid overetching. It is preferable for the duration of the cleaning of the patterned dielectric layer using dilute hydrofluoric acid to be selected to be less than 60 seconds, particularly preferably less than 30 seconds.

The cleaning step in which the patterned dielectric layer is treated with hydrofluoric acid inherently corresponds to the standard cleaning method. The dilute hydrofluoric acid usually contains a buffer salt, particularly preferably $NH_4F$.

As with the processes which have hitherto been customary, in the process according to the invention too wet-chemical cleaning can be carried out first of all after the incineration of the resist mask, in order to remove organic residues which have remained on the patterned dielectric layer after the incineration of the resist mask. The wet-chemical cleaning is generally carried out under oxidizing conditions. Standard processes, for example, as described above, a treatment with $H_2SO_4/O_3$, can be used for this purpose.

The foregoing disclosure of embodiments of the present invention has been presented for purposes of illustration and description. It is not intended to be exhaustive or to limit the invention to the precise forms disclosed. Many variations and modifications of the embodiments described herein will be obvious to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:

1. A method for patterning dielectric layers on semiconductor substrates1 comprising at least the steps of:
   providing a first layer;
   depositing at least one layer formed from a dielectric on the first layer, so that a dielectric layer is obtained;
   depositing a photosensitive resist layer on the dielectric layer;
   exposing and developing the photosensitive resist layer in sections, so that a resist mask is obtained, through which sections of the dielectric layer are uncovered;
   removing the dielectric layer in the sections which have been uncovered through the resist mask at least dawn to a depth which is such that the first layer is uncovered;
   incinerating the resist mask in an oxygen plasma, the incineration being carried out at a temperature which is selected to be approximately 2000° C. or lower, and the oxygen plasma being generated from a gas which at least contains oxygen gas and a forming gas, the oxygen gas being present in an amount of between approximately 60% and 40% volume and the forming gas being present in an amount of between approximately 40% and 60% volume, so that a patterned dielectric layer is obtained, the incinerating minimizing total lost of the patterned dielectric layer in a subsequent step of cleaning; and
   cleaning the patterned dielectric layer using aqueous dilute hydrofluoric acid.

2. The method of claim 1, wherein the duration of the step of incinerating the resist mask is selected to be between 30 s and 120 s.

3. The method of claim 1, wherein the oxygen partial pressure in the gas for generating the oxygen plasma is selected to be between 0.2 and 8.0 Torr.

4. The method of claim 1, wherein the forming gas at least contains nitrogen gas and hydrogen gas.

5. The method of claim 1, wherein the first layer is composed of silicon.

6. The method of claim 5, wherein the dielectric layer comprises at least one layer composed of a silicate glass and/or a silicon carbide.

7. The method of claim 1, wherein the aqueous dilute hydrofluoric acid has an $HF/H_2O$ concentration of less than 1:400.

8. The method of claim 2, wherein the duration of the step of cleaning the patterned dielectric layer using dilute hydrofluoric avid is selected to be less than 60 seconds.

9. The method of claim 8, wherein the dilute hydrofluoric acid comprises a buffer salt.

10. The method of claim 1, wherein a wet-chemical clean is cried out after the resist mask has been incinerated.

11. A method for patterning a dielectric layer on a semiconductor substrate, comprising:
    providing a first layer;
    depositing a layer formed from a dielectric on the first layers so that a dielectric layer is obtained;
    depositing photosensitive resist layer on the dielectric layer;
    exposing and developing the resist photosensitive layer in sections, so that a resist mask is obtained, through which sections of the dielectric layer are uncovered;
    removing the dielectric layer in the sections which have been uncovered through the resist mask at least down to a depth which is such that the first layer is uncovered;
    incinerating the resist mask in an oxygen plasma, the incineration being carried out at a temperature which is selected to be approximately 200° C. or lower, and the oxygen plasma being generated from a gas which at least contains oxygen gas and a forming gas, the oxygen gas being present in an amount of between approximately 60% and 40% by volume and the forming gas being present in an amount of between 40% and 60% by volume, so that a patterned dielectric layer is obtained the incinerating minimizing total lost of the patterned dielectric layer in a subsequent step of cleaning; and
    cleaning the patterned dielectric layer using aqueous dilute hydrofluoric acid.

12. The method of claim 11, wherein the duration of the step of incinerating the resist mask is selected to be between 30 s and 120 s.

13. The method of claim 11, wherein the oxygen partial pressure in the gas for generating the oxygen plasma is selected to be between 0.2 and 8.0 Torr.

14. The method of claim 11, wherein the forming gas at least contains nitrogen gas and hydrogen gas.

15. A method for patterning a dielectric layer on a semiconductor substrate to form contact holes, comprising:
    providing a first layer;
    depositing at least one layer formed from a dielectric on the first layer, so that a dielectric layer is obtained, wherein the dielectric layer is selected from the group consisting of silicon glass and silicon carbide;

depositing a photosensitive resist layer on the dielectric layer;

exposing and developing the photosensitive resist layer in sections, so that a resist mask is obtained, through which sections of the dielectric layer are uncovered;

removing the dielectric layer in the sections which have been uncovered through the resist mask at least down to a depth to expose first layer; and incinerating the resist mask in an oxygen plasma, the incineration being carried out at a temperature which is selected to be approximately 200° C. or lower, and the oxygen plasma being generated from a gas which at least contains oxygen gas and a forming gas, the oxygen gas being present in an amount of between approximately 60% and 40% by volume and the forming gas being present in an amount of between 40% and 60% by volume, so that the patterned dielectric layer is so that a patterned dielectric layer is obtained to form a contact hole, the incinerating minimizing total lost of the patterned dielectric layer in a subsequent step of cleaning and cleaning the patterned dielectric layer using dilute hydrofluoric acid.

16. The method of claim 15, wherein the oxygen gas being present in an amount of between approximately 50% and 40% by volume and the forming gas being present in an amount of between approximately 50% and 60% by volume, so that the patterned dielectric layer is obtained.

17. The method of claim 16, wherein the oxygen partial pressure in the gas for generating the oxygen plasma is selected to be between 0.2 and 8.0 Torr.

18. The method of claim 16, wherein the forming gas at least contains nitrogen gas and hydrogen gas.

19. The method of claim 5, wherein the dielectric layer comprises at least one layer composed of a silicate glass and/or a silicon carbide.

* * * * *

UNITED STATES PATENT AND TRADEMARK OFFICE
CERTIFICATE OF CORRECTION

PATENT NO. : 7,199,060 B2
APPLICATION NO. : 10/724141
DATED : April 3, 2007
INVENTOR(S) : Schwalbe et al.

It is certified that error appears in the above-identified patent and that said Letters Patent is hereby corrected as shown below:

In Col. 9, line 58, delete "2000°C." and insert --200°C.--.
In Col. 9, line 66, delete "lost" and insert --loss--.
In Col. 10, line 21, delete "avid" and insert --acid--.
In Col. 10, line 25, delete "cried" and insert --carried--.
In Col. 10, line 33, delete "resist photosensitive" and insert --photosensitive resist--.
In Col. 10, line 34, delete "a resist" and insert --a photosensitive resist--.
In Col. 10, line 48, delete "lost" and insert --loss--.
In Col. 11, line 18, delete "so that a patterned dielectric layer is obtained" and insert --obtained--.
In Col. 11, line 19, delete "lost" and insert --loss--.

Signed and Sealed this

Eighteenth Day of September, 2007

JON W. DUDAS
*Director of the United States Patent and Trademark Office*